(12) United States Patent
Samuelson et al.

(10) Patent No.: US 6,744,065 B1
(45) Date of Patent: Jun. 1, 2004

(54) SINGLE ELECTRON DEVICES

(75) Inventors: Lars Ivar Samuelson, Malmö (SE); Knut Wilfried Deppert, Lund (SE)

(73) Assignee: BTG International Limited, London (GB)

( * ) Notice: Subject to any disclaimer, the term of this patent is extended or adjusted under 35 U.S.C. 154(b) by 0 days.

(21) Appl. No.: 09/563,200

(22) Filed: May 2, 2000

Related U.S. Application Data

(63) Continuation of application No. PCT/GB98/03429, filed on Nov. 13, 1998.

(30) Foreign Application Priority Data

Nov. 21, 1997 (GB) ................................. 9724642

(51) Int. Cl.[7] ............................................. H01L 29/06
(52) U.S. Cl. ............................ 257/14; 257/20; 257/22; 257/30
(58) Field of Search .............................. 257/14, 20, 22, 257/24, 30

(56) References Cited

U.S. PATENT DOCUMENTS 5,850,064 A * 12/1998 Goldstein ................. 204/157.4

FOREIGN PATENT DOCUMENTS

| EP | 0150 941 A | 8/1985 |
|---|---|---|
| EP | 0562 751 A | 9/1993 |
| EP | 0576 263 A2 | 12/1993 |
| EP | 0606 776 A2 | 7/1994 |
| EP | 0649 174 A | 4/1995 |
| EP | 2284 299 A | 5/1995 |
| EP | 0664 565 A | 7/1995 |
| EP | 0696 065 A | 2/1996 |
| EP | 0750353 A | 12/1996 |
| EP | 0788 149 A | 8/1997 |
| EP | 0322 718 A | 10/1997 |
| EP | 0802 633 A | 10/1997 |
| EP | 0817 284 A | 1/1998 |
| EP | 0836 232 A | 4/1998 |
| EP | 0843 360 A | 5/1998 |
| EP | 0843 361 A | 5/1998 |
| EP | 0865 078 A | 9/1998 |
| EP | 0892 440 A | 1/1999 |
| GB | A-2252870 | 8/1992 |
| GB | A-2256313 | 12/1992 |
| GB | A-2256314 | 12/1992 |
| GB | A-2258236 | 2/1993 |
| GB | A-2261989 | 6/1993 |
| GB | A-2267761 | 12/1993 |
| GB | A-2267997 | 12/1993 |
| GB | A-2268625 | 1/1994 |
| GB | A-2275820 | 9/1994 |
| GB | A-2278013 | 11/1994 |
| GB | A-2283128 | 4/1995 |
| WO | WO 94/15340 | 7/1994 |
| WO | WO 97 36333 A | 10/1997 |

OTHER PUBLICATIONS

Peng, Xiaogang, et al., "Epitaxial Growth of Highly Luminescent CdSe/Cd/S Core/Shell Nanocrystals . . . " J. Am. Chem. Soc., 1997, 119, 7019–7029.*

Deppert K et al: "A New Method to Fabricate Size–selected Compound semiconductor Nanocrystals: Aerotaxy" Journal of Crystal Growth, vol. 169, No. 1, 1996, pp. 13–19, XP002064630. See Whole document.

(List continued on next page.)

*Primary Examiner*—Sara W. Crane
(74) *Attorney, Agent, or Firm*—Miles & Stockbridge P.C.

(57) ABSTRACT

A single electron tunnelling device is formed by positioning between first and second electrodes a particle formed of a material having a first conductivity characteristic having a surface layer of a material of a second conductivity characteristic, the thickness of said layer being sufficiently small to support quantum mechanical tunnelling therethrough.

17 Claims, 4 Drawing Sheets

OTHER PUBLICATIONS

Kazuhiko Matsumoto et al: "Comparison of Experimental andTheoretical Results of Room Temperature Operated Single Electron Transistor made by STM/AFM nano—oxidation process" Technical Digest of the International Electron Devices Meeting (IEDM) Washington, Dec. 10–13, 1995, pp. 363–366, XPOOO624737. Institute of Eectrical and Electronic Engineers.

Okada H et al: "Observation of coulomb Blockade Type Conductance Oscillations up Toepitaxy on INP Substrates 50k in Gated Ingaas Ridge Quantum Wires grown by Molecular Beam" Japanese Journal of Applied Physics, vol. 36, No. 38, part 01, Mar. 1997, pp. 1672–1677, XP000703095.

Samuelson L et al: "Studies of GaInAs/Inp quantum dots processed from aerosol deposited particles" Conference Proceedings. Sixth International Conference on Indium Phosphide and Related Materials (CAT. No. 94CH3369–6). Proceedings of 1994 IEEE 6th International Conference on Inium Phosphide and Related materials (IPRM), Santa Barbara, CA, USA, 27–, ISBN 0–7803–1476–X, 1994, New York, NY, USA, IEEE, USA, pp. 379–382, EPOO2064631.

Single Electron Device and their Applications Konstantin K Likharev, Proc IEEE vol. 87, No. 4, Apr. 1999, pp 606–632.

Single Electron Memory for Giga–to–Tera Storage, Yano et al, Proc. IEEE Vol 87, No 4, Apr. 1999 pp 633–651.

Nanoscale CMOS Wong et al, Proc IEEE vol. 87, No. 4 Apr. 1999, pp 537–570.

Tunneling–Based SRAM J.P.A. Van Der Wagt, Proc. IEEE vol. 87, No. 4 Apr. 1999, pp 571–595.

M I Lutwyche and Y Wada "Estimate of the Ultimate performance of the single–electron Transistor", J.Appl.Phys. 1994, 75, pp. 2654–3661.

David L Klein et al "A single–electron transistor made from a cadmium selenide nanocrystal", Nature, Vol 389, Oct. 1997, pp. 699–701.

* cited by examiner

SINGLE ELECTRON DEVICES

This is a continuation of PCT application PCT/GB98/03429, filed Nov. 13, 1998, the entire content of which is hereby incorporated by reference in this application.

This invention relates to electronic components and, in particular, to so-called single-electron devices and to methods of manufacture thereof.

BACKGROUND OF THE INVENTION

The field of single electron devices emerged from investigations of the tunnel junction, which consists of two electrodes of a conducting material, separated by a thin layer of an insulating material having a thickness of about one nanometre. According to the laws of quantum mechanics, electrons have a small probability of tunnelling through such an insulating layer. If a voltage is applied across the junction, electrons will tunnel preferentially in one particular direction through the insulator. Hence, they will carry an electric current through the junction. The magnitude of the current depends on both the thickness of the insulating layer and the material properties of the conducting electrodes.

In early 1985, Averin and Likharev attempted to predict the behaviour of very small tunnel junctions with superconducting electrodes but the equations were too complex to be easily solved. However, for a small tunnel junction with electrodes of normal conductors, if a constant electric current is passed through a junction, it will induce a voltage that oscillates periodically in time. These periodic oscillations have a frequency equal to the current divided by the charge of an electron. This frequency is totally independent of any other parameters of the system. An alternative view is that each oscillation represents the response of the device as a single electron tunnels through the insulating layer. The phenomenon is known as single-electron tunnelling (SET) oscillations.

To understand this effect, one must appreciate how electric charge moves through a normal conductor such as an aluminium wire. An electric current can flow through the conductor because some electrons are free to move through the lattice of atomic nuclei. Despite the motion of the electrons, any given volume of the conductor has virtually no net charge because the negative charge of the moving electrons is always balanced by the positive charge of the atomic nuclei in each small region of the conductor. Hence, the important quantity is not the charge in any given volume but rather how much charge has been carried through the wire. This quantity is designated as the "transferred" charge. This charge may take practically any value, even a fraction of the charge of a single electron. The reason for this is that charge is proportional to the sum of shifts of all the electrons with respect to the lattice of atoms. Because the electrons in a conductor can be shifted as little or as much as desired, this sum can be changed continuously, and therefore so can the transferred charge.

If a normal conductor is interrupted by a tunnel junction, electric charge will move through the system by both a continuous and a discrete process. As the transferred charge flows continuously through the conductor, it will accumulate on the surface of the electrode against the insulating layer of the junction (the adjacent electrode will have equal but opposite surface charge). This surface charge Q may be represented as a slight continuous shift of the electrons near the surface from their equilibrium positions. On the other hand, quantum mechanics shows that the tunnelling can only change Q in a discrete way: when an electron tunnels through the insulating layer, the surface charge Q will change exactly by either +e or −e, depending on the direction of tunnelling. The interplay between continuous charge flow in conductors and discrete transfer of charge through tunnel junctions leads to several interesting effects. These phenomena can be observed when the tunnel junctions are very small and the ambient temperatures are very low. (Low temperatures reduce thermal fluctuations that disturb the motion of electrons.) In this case, if the charge Q at the junction is greater than +e/2, an electron can tunnel through the junction in a particular direction, subtracting e from Q. The electron does so because this process reduces the electrostatic energy of the system. (The energy increases in proportion to the square of the charge and does not depend on the sign of the charge.) Likewise, if Q is less than −e/2, an electron can tunnel through the junction in the opposite direction, adding e to Q, and thus again decrease the energy. But if Q is less than +e/2 and greater than −e/2, tunnelling in any direction would increase the energy of the system. Thus, if the initial charge is within this range, tunnelling will not occur. This suppression of tunnelling is known as the Coulomb blockade.

If the surface charge Q is zero initially, then the system is within the Coulomb blockade limits, and tunnelling is suppressed. Therefore, the current flowing from the source through wires will start to change the charge Q continuously. For convenience, assume that the deposited charge rate is positive rather than negative. If the charge reaches and slightly exceeds +e/2, tunnelling becomes possible. One electron will then the junction, making its charge slightly greater than −e/2. Hence, the system is within the Coulomb blockade range again, and tunnelling ceases to be possible. The current continues to add positive charge to the junction at a constant rate, and Q grows until it exceeds +e/2 again. The repetition of this process produces the single-electron tunnelling (SET oscillations: the voltage changes periodically with a frequency equal to the current divided by the fundamental unit of charge, e.

To produce SET oscillations, tunnel junctions must be of a very small area and cooled to ensure that the thermal energy does not influence tunnelling. Typically, the device must be cooled to temperatures of about a tenth of a degree above absolute zero if the junction is 100 nanometres in length and width.

European Patent Application EP 0 750 353 discloses a single electron tunnel device of this invention which includes a multiple tunnel junction layer including multiple tunnel junctions; and first and second electrodes for applying a voltage to the multiple tunnel junction layer, wherein the multiple tunnel junction layer includes an electrically insulating thin film and metal particles and/or semiconductor particles dispersed in the electrically insulating thin film.

The electrically insulating thin film may be made of an oxide and the particles may be of at least one type of metal selected from the group consisting of gold (Au), silver (Ag), copper (Cu), platinum (Pt), and palladium (Pd).of the particles. Their diameter may be 50 nm or less.

Fabrication of suitable structures to support single electron tunnelling has proved difficult. In particular, it has proved difficult to form films having the size and disposition which are suitable for tunnelling. However, we have now devised a method suitable for the fabrication of arrays of these devices.

BRIEF DESCRIPTION OF THE INVENTION

According to one aspect of the present invention there is provided a single electron tunnelling device comprising a particle of a material having a first conductivity characteristic having a surface layer of a material of a second conductivity characteristic, the thickness of said layer being sufficiently small to support quantum mechanical tunnelling therethrough together with first and second electrodes positioned adjacent to said particle to facilitate the flow of current therebetween.

Said first and second electrodes may be superconducting.

In a preferred embodiment of the invention a plurality of such particles is positioned between said first and second electrodes.

There is also provided a method of fabricating single electron devices comprising the steps of forming a plurality of particles forming a layer of a thickness sufficiently small to support quantum mechanical tunnelling on the surface of said particles and positioning at least one of said particles between a pair of electrodes to form a single electron device.

BRIEF DESCRIPTION OF THE DRAWINGS

The invention will be particularly described by way of example with reference to the accompanying drawings, in which.

DETAILED DESCRIPTION OF PREFERRED EMBODIMENTS

Figure 1:
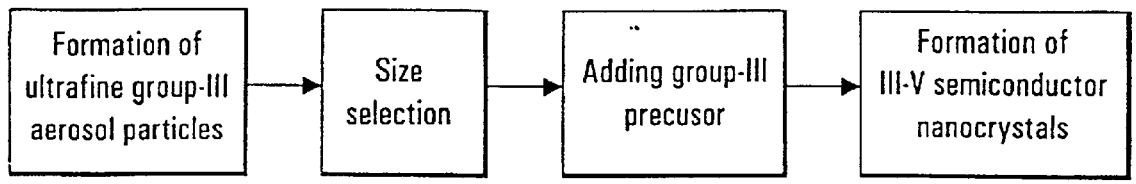
FIG. 1 is a flow chart illustrating the method according to one aspect of the present invention.

Referring now to FIG. 1 of the drawings, this illustrates a process for controlled formation of simple and multi-layered metallic and semiconducting nanocrystals or nanoparticles suitable for single electron device fabrication. Ultra-fine particles of a Group III element are formed as an aerosol. These are then filtered to select those of a predetermined size. A Group V precursor is then added and the mixture processed to form nanocrystals of a III–V semiconductor.

Figure 2:
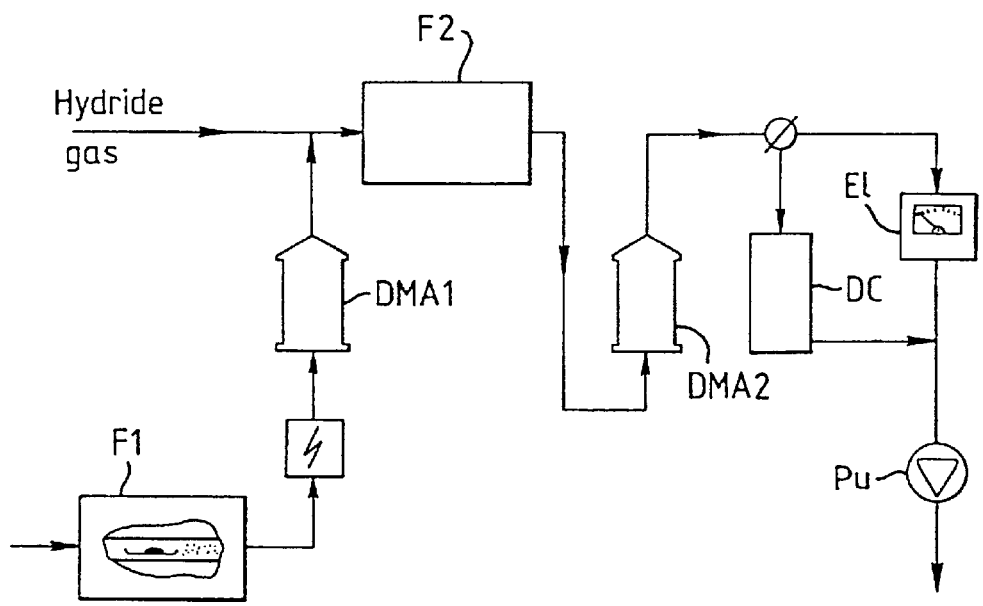
FIG. 2 is shows in schematic form apparatus for producing nanocrystals suitable for use for the fabrication of single-electron devices.

FIG. 2 shows an aerosol production unit in accordance with a specific embodiment of the invention. This comprises a furnace F1 which generates metallic particles by sublimation. These particles are then carried in a transport gas stream through a charger to a particle size filter DMA1 and thence to a second furnace F2 where the gas stream is mixed with the hydride of a Group V element and heated to form nanoparticles of a III–V semiconductor. The nanocrystals are then filtered to select those of a predetermined size which are then deposited on to a substrate, which, preferably is a semiconducting wafer, in a deposition chamber DC. An electrometer E1 and pump Pu are connectable to the flow line to create and measure the pressure therein.

In one embodiment, a semiconducting core nanocrystal is coated by a surface layer of a material with different properties, e.g. with a larger fundamental band-gap, fabricating nanocrystals, the composition and size of which is tightly controlled. The approach is unusual in that we have managed to form, in an aerosol phase, metallic nanoparticles (or droplets) having a narrow dimensional spread. The particles of elements from the third column in the periodic table are later allowed to react with a vapour containing selected atoms or molecules from the fifth column in the periodic table, resulting in the production of nanocrystals of III–V semiconductors of uniform size. This control requires a completely saturated conversion of the primary metallic nanoparticle into the corresponding III–V nanocrystal.

Gallium arsenide nanocrystals, of approximate diameter 10 nm, have been produced and deposited on various substrates. The fabrication route allows the production of nanocrystals with a very narrow size distribution. It utilises the formation of ultrafine gallium particles and their self-limiting reaction with arsine at elevated temperatures. The kinetics of the reaction of gallium to produce gallium arsenide depends on the temperature and the arsine flow. The temperature at which the reaction began was found to be as low as 200° C. This permitted the production of nanocrystals of compound semiconductors of predetermined size in a simple, reliable, and efficient way.

An important feature of a further embodiment of this invention is a new technique for controllable formation of a surface layer of a different semiconducting or insulating material on these original nanocrystals. They may have a homogeneous core and a surface layer of a second composition with an appropriate electronic structure for the single-electron device operation.

After a size selection, the semiconducting or metallic nanocrystal is exposed to a reacting gas environment while being maintained in the aerosol phase. In one embodiment, a mono-disperse aerosol of silicon nanocrystals is allowed to react with oxygen under closely controlled conditions, leading to a controlled thickness of the silicon particle being converted to silica. $SiO_2$ is an insulator with ideal and well characterised interfaces with silicon. In a second embodiment, mono-disperse nanocrystals of compound semiconductors, such as indium arsenide, are allowed to interact with phosphorus-containing gaseous molecules, an interaction which results in exchange processes by which arsenic atoms in a finite depth surface layer are replaced by phosphorus atoms, hence transforming the surface to a surface layer of In(As)P. In a third embodiment, pre-fabricated nanoparticles of indium react with oxygen to form a skin of InO. In this embodiment, the simplest single-electronic building block is formed by producing a homogenous particle, exemplified by a spherical monodisperse particle shown in FIG. 3.

Figure 3:
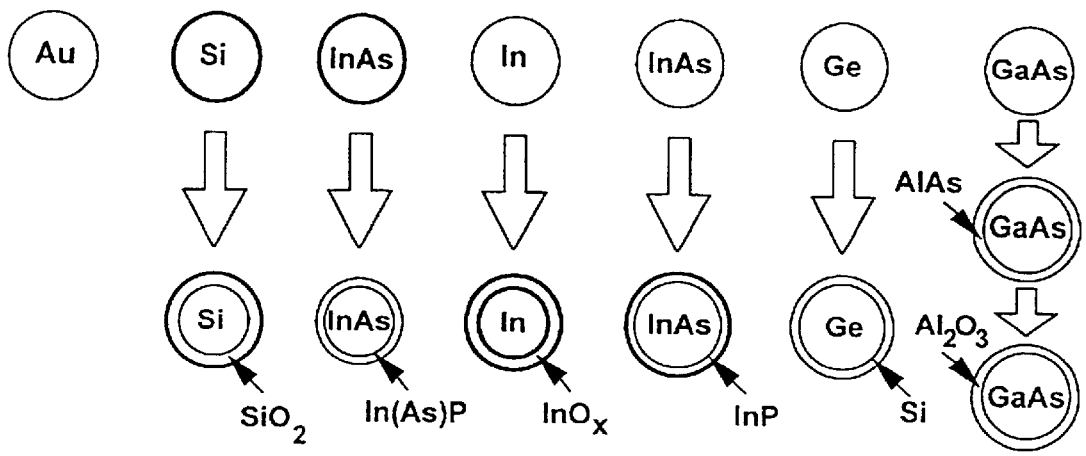
FIG. 3 shows the structure of various nanoparticles.

The second embodiment involves direct epitaxial deposition of a different material on the surface of a primary core, often called hetero-epitaxy. The art of hetero-epitaxy on flat surfaces is at a very advanced stage but the use of nanoparticles as "substrates" for aerosol-phase epitaxial crystal growth is very novel. For the application of nanoparticles in single-electronics, however, this is of great importance. Examples are the coating of a small band-gap semiconductor with a thin epitaxial layer of a larger band-gap material, such as indium phosphide on the surface of indium arsenide or silicon on the surface of a core of germanium. Finally there is a hetero-epitaxy based mechanism for formation of semiconductor particles surrounded by very well controlled insulating layers, which can be achieved by surrounding a nanocrystal of gallium arsenide (for example) with a few monolayers of epitaxially grown aluminium arsenide. At a late stage, this aluminium arsenide layer is allowed to react with oxygen to form a layer of aluminium oxide, most probably $Al_2O_3$, which is an excellent insulator. Hence, the ideal hetero-expitaxial process will lend itself indirectly to the formation of a few mono-layer-thick insulating layer on semiconductor particles. (FIG. 3)

Figure 4:
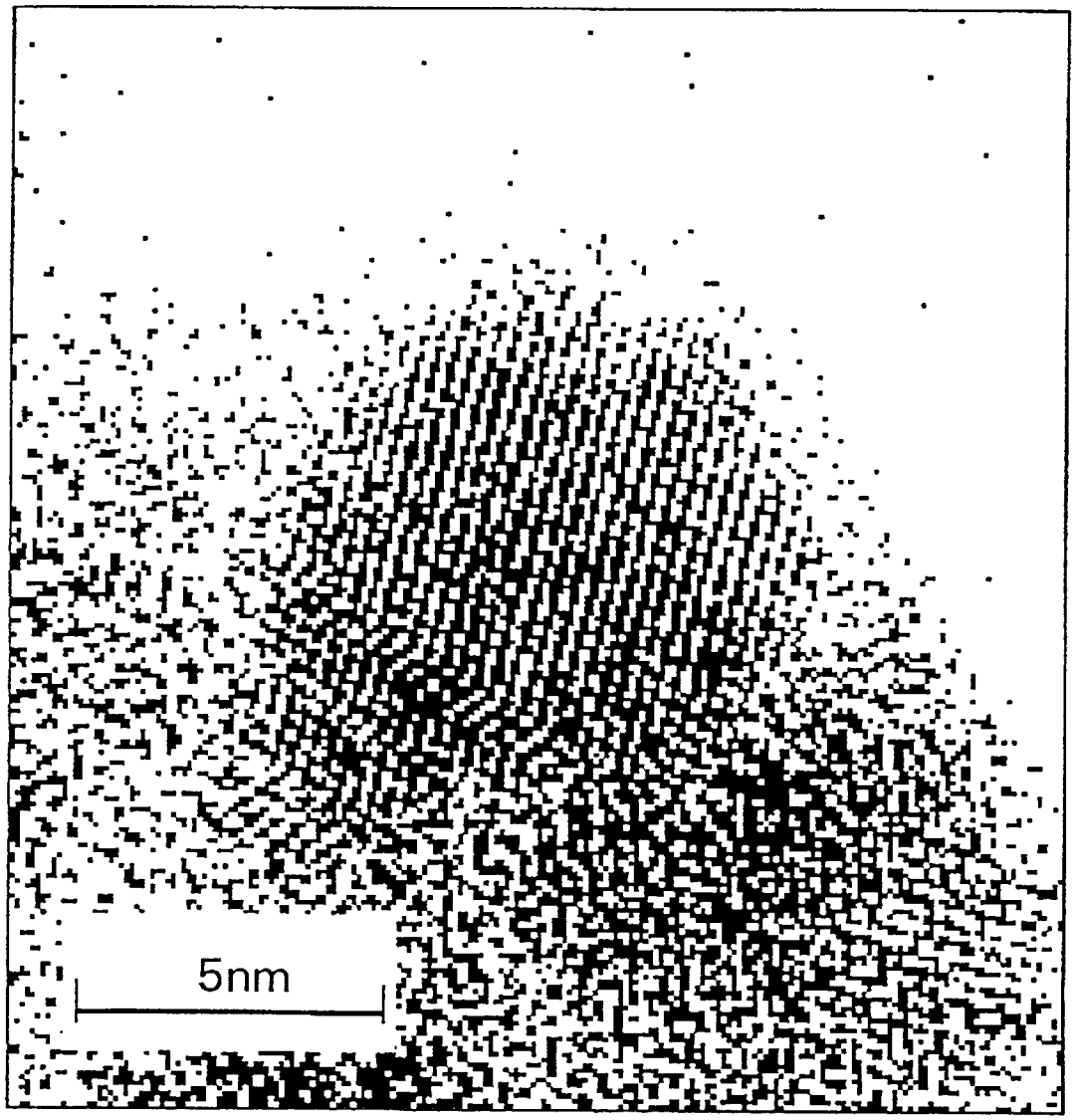
FIG. 4 is a micrograph of a nanocrystal produced by the process of aerotaxy

FIG. 4 is a TEM image of an 8 nm indium phosphide particle produced by the process of aerotaxy.

In the mechanism of single-electron devices, the most important fundamental property is the existence of a central conductive island which is coupled by tunnelling to source and drain electrodes and coupled capacitively to a gate electrode. The size-related capacitance of the central island should be sufficiently low that the electrostatic charging energy $E = e^2/2C$ is much larger than kT and in an energy range suitable for device and circuit biasing. The dimensional requirements can be described as:

for particle size, the diameter for room temperature operation should be in the range 2–4 nm, corresponding to charging energy of a few hundred meV, to be compared with kT (~26 meV at room temperature).

for tunnelling gaps, the distances between conducting leads and conducting particle, and the distance between connected particles should support tunnelling, that is it should be in the range 1–3 nm.

In most prior demonstrations of single-electron phenomena, low temperatures at or below liquid helium boiling temperature (4 K) have been employed. The tolerance for lithographic definition of the island size is much relaxed. In these studies, tunnelling distances are often defined by an aluminium film, which is converted by controlled oxidation into an insulating thin film, placed in between the conductors.

Experiments performed at elevated temperatures, such as the boiling point of liquid nitrogen (77 K) or at room-temperature (300 K) have been performed with the use of small metallic (or semiconducting) particles but with the tunnelling distances controlled by a thin insulating film on which the particle rests and, for the second electrode spacing, by a tunnelling distance which is controlled by a scanning tunnelling microscope.

We have been able to fabricate planar single-electron devices which are controllably created by a "nano-robot", an atomic force microscope (AFM), by manipulation of size-selected nanometre sized particles relative to pre-fabricated contacts. In this approach capacitances are accurately controlled by the exact particle fabrication (by aerosol technique) and tunnelling gaps are governed by the controlled positioning of the nano-particles to create the proper tunnelling current levels.

Figure 5:
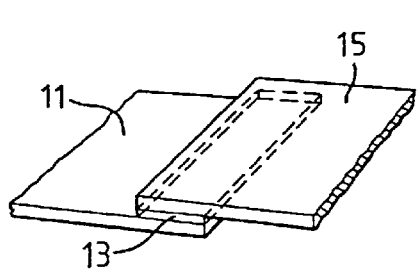
FIG. 5 is a schematic diagram of a prior art tunnel junction
Figure 6:
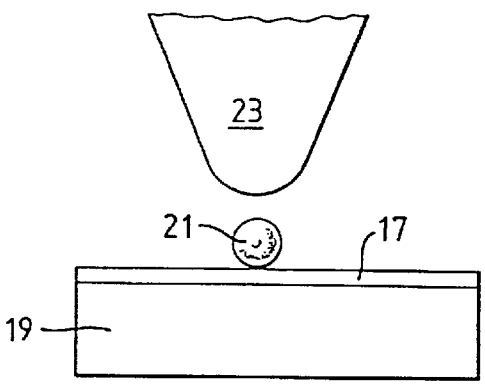
FIG. 6 is a schematic diagram showing a barrier between a nanoparticle and a conducting substrate.
Figure 7:
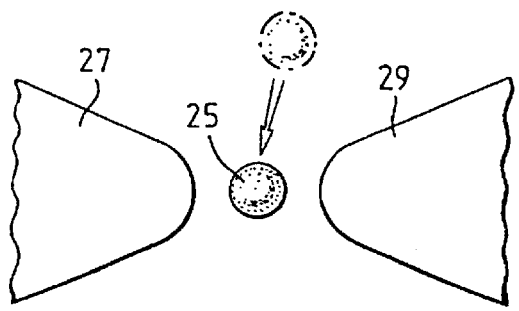
FIG. 7 is a diagram illustrating the principle of movement of a nanoparticle by means of an atomic force microscope.

FIG. 5 illustrates a conventional thin film tunnel junction device. The surface of a deposited film 11 is oxidise to form a thin tunnel barrier 13 and a further conductor 15 is deposited thereon. An analogous device based on a small metallic particle is illustrated in FIG. 6. A thin oxide layer 17 is formed on a conductive substrate 19, and small metallic particle 21 is positioned thereon. Contact is made by means of the tip of a scanning tunnelling microscope 23. This principle is extended in the device illustrated in FIG. 7 in which a small metallic particle 25 is positioned between a source electrode 27 and a drain electrode 29 by means of an atomic force microscope.

A key feature of one aspect of the present invention is the pre-fabrication of particles in such a way that they provide the conducting core as well as tightly controlled tunnel-gap, building a network of identical capacitances and tunnelling rates permits randomness in lateral location within an ensemble of nano-particles.

Figure 8A:
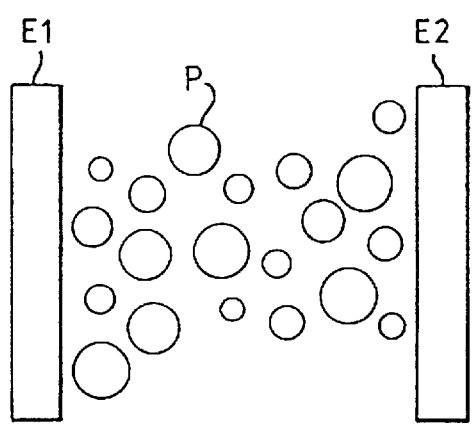
FIGS. 8a and 8b are schematic diagrams illustrating the principles of device construction in accordance with the invention
Figure 8B:
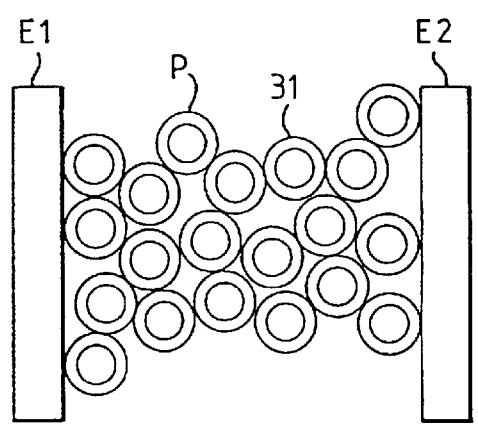

The significance of the above aerosol-based fabrication of granular single-electron circuits is illustrated in FIGS. 8a, and 8b which show a two-dimensional arrangement of nano-particles P between two electrodes E1, E2 with non-identical (FIG. 8a) vs identical cores (FIG. 8b) as well as with random vs well-controlled tunnel barriers 31. The tunnel barrier in most cases is exactly twice the shell thickness, in two-dimensional as well as three-dimensional randomly arranged arrays. The key feature is that, due to nature of the single-electron tunnelling characteristic, for a macroscopic device the number of nanoparticles (in either two or three dimensions) between the electrodes is not critical.

What is claimed is:

1. A single electron tunnelling device comprising a particle together with first and second electrodes positioned adjacent to said particle to facilitate the flow of current therebetween, said particle being formed of a material with a first conductivity characteristic having a surface layer of a material with a second conductivity characteristic, said surface layer being semiconducting, and the thickness of said surface layer being sufficiently small to support quantum mechanical tunnelling therethrough.

2. A single electron tunnelling device comprising a particle together with first and second electrodes positioned adjacent to said particle to facilitate the flow of current therebetween, said particle being formed of a material with a first conductivity characteristic having a surface layer of a material with a second conductivity characteristic, said surface layer being gallium arsenide, and the thickness of said surface layer being sufficiently small to support quantum mechanical tunnelling therethrough.

3. A single electron tunnelling device comprising a particle together with first and second electrodes positioned adjacent to said particle to facilitate the flow of current therebetween, said particle being formed of a material with a first conductivity characteristic having a surface layer of a material with a second conductivity characteristic, said surface layer being indium oxide, and the thickness of said surface layer being sufficiently small to support quantum mechanical tunnelling therethrough.

4. A single electron tunnelling device comprising a particle together with first and second electrodes positioned adjacent to said particle to facilitate the flow of current therebetween, said particle being formed of a material with a first conductivity characteristic having a surface layer of a material with a second conductivity characteristic, said surface layer being indium arsenide phosphide, and the thickness of said surface layer being sufficiently small to support quantum mechanical tunnelling therethrough.

5. A single electron tunnelling device comprising a particle together with first and second electrodes positioned adjacent to said particle to facilitate the flow of current therebetween, said particle being formed of a material with a first conductivity characteristic having a surface layer of a material with a second conductivity characteristic, said surface layer being silica, and the thickness of said surface layer being sufficiently small to support quantum mechanical tunnelling therethrough.

6. An electronic device, comprising:
first and second electrodes, and a current flow path therebetween, the current flow path comprising at least one particle, said at least one particle having a diameter of a predetermined nanometric value such as to give rise to current flow by single electron tunnelling; and
said at least one particle comprising a nanocrystal having an inner core and an outer shell, the inner core comprising a conductive material of predetermined dimensions, and the outer shell comprising a further material of predetermined dimensions which further material is different from that of the inner core but is epitaxially formed therewith.

7. The device of claim 6, wherein said further material is insulating.

8. The device of claim 7, wherein said conductive material contains one of:

silicon, germanium, indium and gallium.

9. The device of claim 6, wherein said further material is semiconducting.

10. The device of claim 9, wherein said conductive material contains one of the following:

indium, germanium, gallium, silicon;

and said further material is semiconducting and contains one of the following:

indium, germanium, gallium, silicon.

11. The device of claim 6, wherein said current flow path comprises a multiplicity of said particles stacked adjacent one another, whereby to form a single electron tunnelling device.

12. An electronic device, comprising:

first and second electrodes, and a current flow path therebetween, the current flow path comprising at least one;

said at least one particle having an inner core comprising a conductive material, said inner core having a diameter of a predetermined nanometric value;

said at least one particle having an outer shell, said outer shell having a diameter of a predetermined nanometric value, and said outer shell comprising a further material which is inorganic and different from that of the inner core; and said at least one particle giving rise to current flow in the current flow path, the characteristics of which are determined by electron tunnelling via said outer shell and said inner core.

13. The device of claim 12, wherein said further material is insulating.

14. The device of claim 13, wherein said conductive material contains one of:

silicon, germanium, indium and gallium.

15. The device of claim 12, wherein said further material is semiconducting.

16. The device of claim 15, wherein said conductive material contains one of the following:

indium, germanium, gallium, silicon;

and said further material is semiconducting and contains one of the following:

indium, germanium, gallium, silicon.

17. The device of claim 12, wherein said current flow path comprises a multiplicity of said particles stacked adjacent one another, whereby to form a single electron tunnelling device.

* * * * *